United States Patent [19]

Matsumura et al.

[11] Patent Number: 5,701,627
[45] Date of Patent: Dec. 30, 1997

[54] SUBSTRATE PROCESSING APPARATUS

[75] Inventors: Yoshio Matsumura; Katsumi Shimaji, both of Hikone, Japan

[73] Assignee: Dainippon Screen Mfg. Co., Ltd., Japan

[21] Appl. No.: 720,317

[22] Filed: Sep. 27, 1996

Related U.S. Application Data

[63] Continuation of Ser. No. 397,486, Mar. 2, 1995, abandoned.

[30] Foreign Application Priority Data

Mar. 3, 1994 [JP] Japan ................................ 6-033627

[51] Int. Cl.$^6$ .................................................. B08B 7/04
[52] U.S. Cl. .................................. 15/88.2; 134/61; 134/902
[58] Field of Search ............................ 134/61, 902; 15/88.1, 15/88.2, 21.1

[56] References Cited

U.S. PATENT DOCUMENTS

| | | | |
|---|---|---|---|
| 4,208,760 | 6/1980 | Dexter et al. | 134/133 X |
| 4,985,722 | 1/1991 | Ushijima et la. | 134/902 X |
| 5,092,011 | 3/1992 | Gommori et al. | 15/88.2 |
| 5,168,887 | 12/1992 | Thompson et al. | 134/902 |
| 5,345,639 | 9/1994 | Tanoue et al. | 15/88.2 |
| 5,445,171 | 8/1995 | Ohmori et al. | 134/902 X |

FOREIGN PATENT DOCUMENTS

3187  1/1993  Japan ................................ 134/902

*Primary Examiner*—Philip R. Coe
*Attorney, Agent, or Firm*—Ostrolenk, Faber, Gerb & Soffen, LLP

[57] ABSTRACT

A single transport path for transporting a substrate between the cassettes and a plurality of processing units, is arranged between the cassette storing means and the processing means. Hence, it is possible to skip some processing units or to change the order of the processing units easily, with simplifying the construction of the apparatus. Furthermore, the single transport path causes to reduce the space for transporting the substrate.

17 Claims, 6 Drawing Sheets

SUBSTRATE PROCESSING APPARATUS

This is a Continuation application of application Ser. No. 08/397,486, filed on Mar. 2, 1995 now abandoned.

BACKGROUND OF THE INVENTION

1. Field of the Invention

The present invention relates to a substrate processing apparatus in which a plurality of substrates stored in a cassette are taken out of one by one to be transported to a plurality of processing units for being processed in said processing units serially.

2. Description of the Background Art

As a substrate processing apparatus in which a plurality of substrates stored in a cassette are taken out of the cassette one by one, and transported to a plurality of processing units arranged serially in a predetermined order to be processed, an apparatus of a flow type is known. In this type of substrate processing apparatus, a loading section, a processing section including a plurality of processing units, and an unloading section are arranged in a predetermined transport path. Each of substrates stored in the cassette is taken out of the cassette one by one, and put on a transporting mechanism having a plurality of transporting rollers. The substrate put on the transporting mechanism is transported serially through said plurality of processing units to be processed serially in each of said processing units. The substrate transported through all of said processing units is serially stored in a cassette located in the unloading section.

In this type of substrate processing apparatus, each substrate must be transported through each of the processing units in the order determined by the arrangement of the processing units. Hence, it is difficult to skip some processing units or to change the order of the processing units. Further, the substrate processing apparatus of the flow type is too long along the transport path, since the loading section, a plurality of processing units, and the unloading section are arranged along it.

To overcome the disadvantage of the flow type substrate processing apparatus, another type of substrate processing apparatus is proposed in U.S. Pat. No. 4,985,722. In this type of substrate processing apparatus, a loading/unloading section, an interface mechanism for taking out of a substrate stored in a cassette put on the loading/unloading section and for taking a processed substrate into a cassette put thereon, a conveying mechanism for transporting the substrate taken out by the interface mechanism, and a plurality of processing units, are provided. The conveying mechanism can move along a transport path, and the plurality of processing units are arranged both sides of the transport path. Thus, a substrate taken out of the cassette by the interface mechanism is delivered to the conveying mechanism, and inserted to each of the plurality of processing units in a predetermined order by the conveying mechanism. The substrate processed by all of the processing units is transported by the conveying mechanism to the interface mechanism, and supplied to the cassette in the loading/unloading section by the interface mechanism.

The conveying mechanism of the substrate processing apparatus disclosed by U.S. Pat. No. 4,985,722 can directly supply the substrate to all of the processing units and can take the processed substrate out of all of the processing units. Thus, in this apparatus, it is easy to skip some processing units or to change the order of the processing units, if necessary. Additionally, the length of whole apparatus can be reduced, because all of the processing units are arranged both sides of the transport path.

However, all of the substrates taken out of the cassette by the interface mechanism should be delivered one by one to the conveying mechanism, and all of the processed substrates should be delivered one by one from the conveying mechanism to the interface mechanism. It makes the apparatus more complex. Furthermore, the apparatus is large since both the interface mechanism and the conveying mechanism have a respective transport path along which the substrate is transported.

SUMMARY OF THE INVENTION

It is an object of the present invention to provide a substrate processing apparatus having a simple construction and a small transport path and which makes it easy to skip some processing units or to change the order of processing units.

The present invention relates to a substrate processing apparatus for transporting a plurality of substrates stored in a cassette serially one by one to a plurality of processing units in each of which a substrate set therein is processed by respective manner, comprising: cassette storing means for storing a plurality of cassettes, each of which is capable of storing a plurality of substrates, said plurality of cassettes being arranged in a predetermine direction; processing means, including a plurality of processing units, for processing the substrate in a predetermined manner, said plurality of processing units being arranged parallel to said predetermined direction; and transporting means, disposed between said cassette storing means and said processing means, for transporting the substrate stored in said cassette in the cassette storing means to one of the processing units in the processing means, and for transporting the substrate processed by said processing means to the cassette.

According to the present invention, a single transport path for transporting a substrate between the cassettes and a plurality of processing units, is arranged between the cassette storing means and the processing means. Hence, it is possible to skip some processing units or to change the order of processing units easily, with simplifying the construction of the apparatus. Furthermore, the single transport path causes to reduce the space for transporting the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
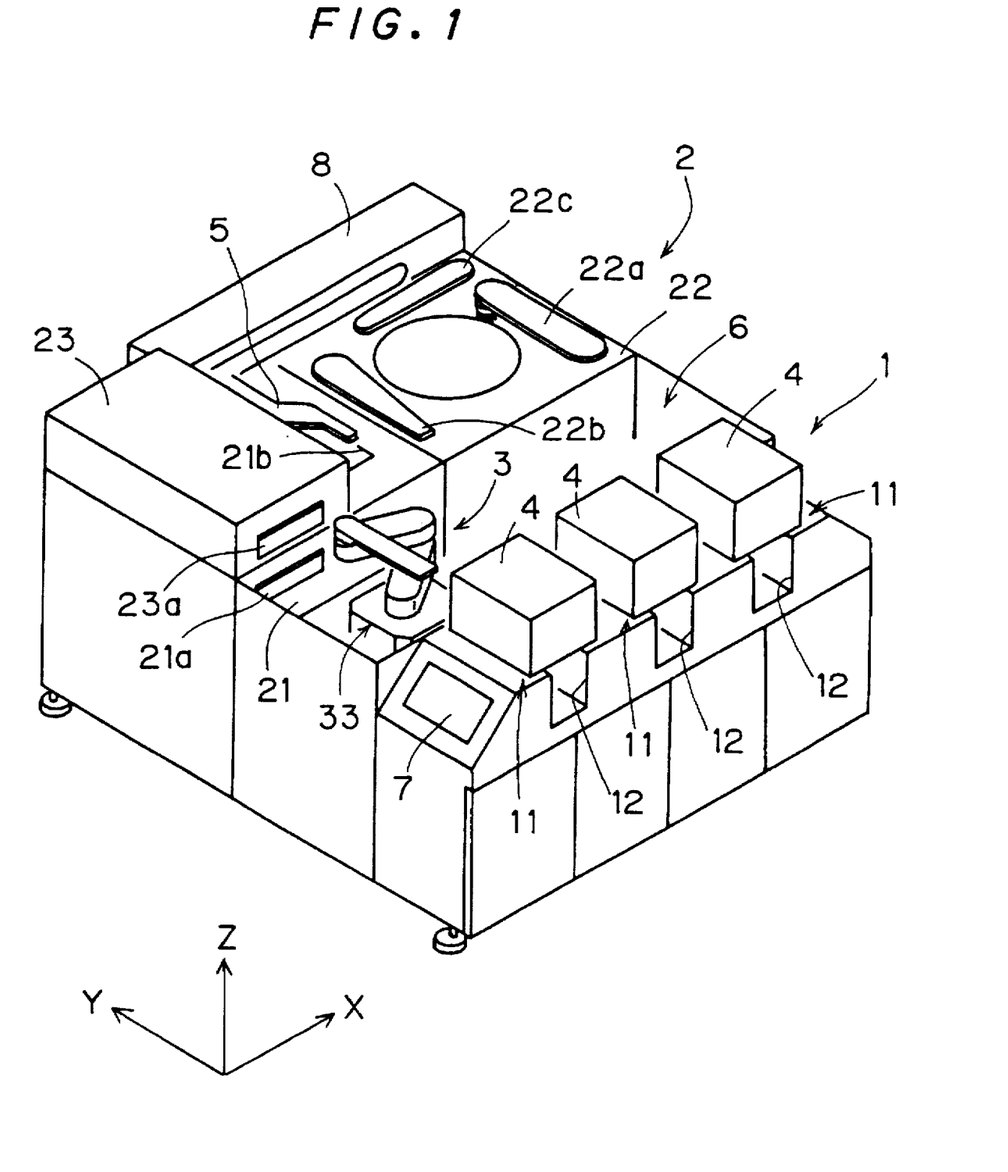
FIG. 1 is a perspective view of a substrate processing apparatus according to a preferred embodiment of the present invention.
Figure 2:
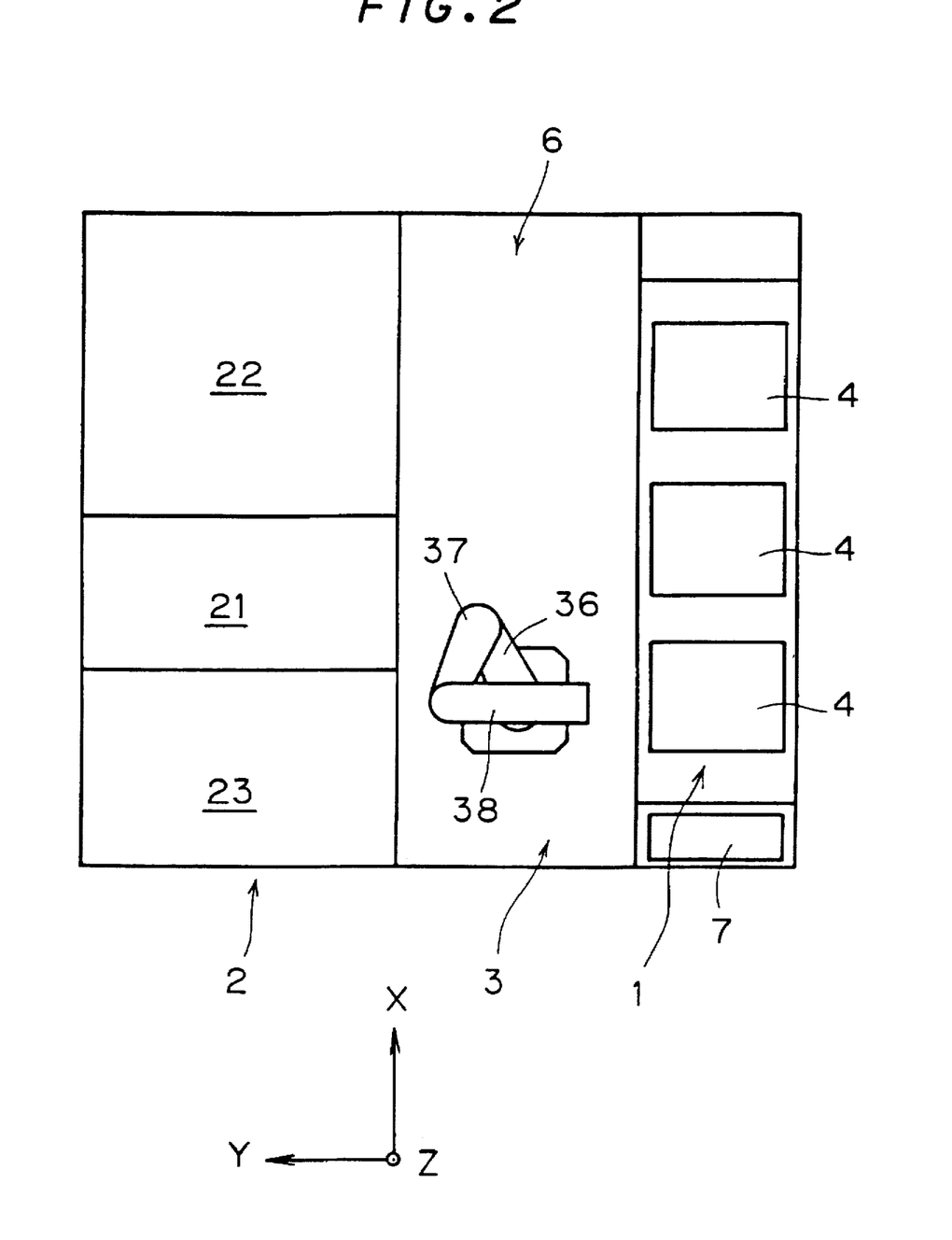
FIG. 2 is a plan view of the apparatus of FIG. 1.

FIG. 1 is a perspective view of a substrate processing apparatus according to a preferred embodiment of the present invention, and FIG. 2 is a plan view of the apparatus of FIG. 1. The illustrated apparatus is used to clean a substrate, and comprised of a cassette storing system 1, a processing system 2 and a transporting system 3.

The cassette storing system 1 includes three cassette mounting portions 11 which are arranged in a direction X. Each cassette mounting portion 11 is for receiving a cassette 4 which can contain a plurality of substrates (for example, substrate), twenty-five. When an AGV (auto guided vehicle) not shown, moves to the substrate processing apparatus and mounts the cassettes 4 onto the respective cassette mounting portions 11 to arrange three cassettes 4 in the direction X, it is possible to unload or load substrates from or into the cassettes 4 by the transporting mechanism 3. In short, the cassette storing system 1 functions as both the substrate supplying part and the substrate receiving part of the conventional substrate processing apparatus. In FIG. 1, generally noted at 12 are recesses in which each cassette 4 is transferred between the substrate processing apparatus and the AGV.

The processing system 2 includes a brush module 21 for cleaning both surfaces (or only the back surface) of a substrate and a spin part 22 for cleaning the surfaces of the substrate while spinning the substrate. The brush module 21 and the spin part 22 are arranged to face each other at a certain distance from the cassette storing system 1 in a direction Y but to be approximately parallel to the direction X in which the cassettes 4 are arranged. Above the brush module 21, a UV lamp house 23 is disposed which performs ashing of organic substances on the upper surface of the substrate by irradiation of ultraviolet light, i.e., dry cleaning. Thus, a plurality of the processing units (the brush module 21, the spin part 22 and the UV lamp house 23 will be each hereinafter generally referred to simply as "processing unit.") are disposed in the processing system 2. Thus, a substrate is transported to each of the processing units in an appropriate order so as to be cleaned. In this embodiment, on the back side of the processing system 2 with respect to the cassette storing means 1, a transport hand 5 is disposed to transport a substrate from the brush module 21 to the spin part 22 as shown in FIG. 1.

Figure 3:
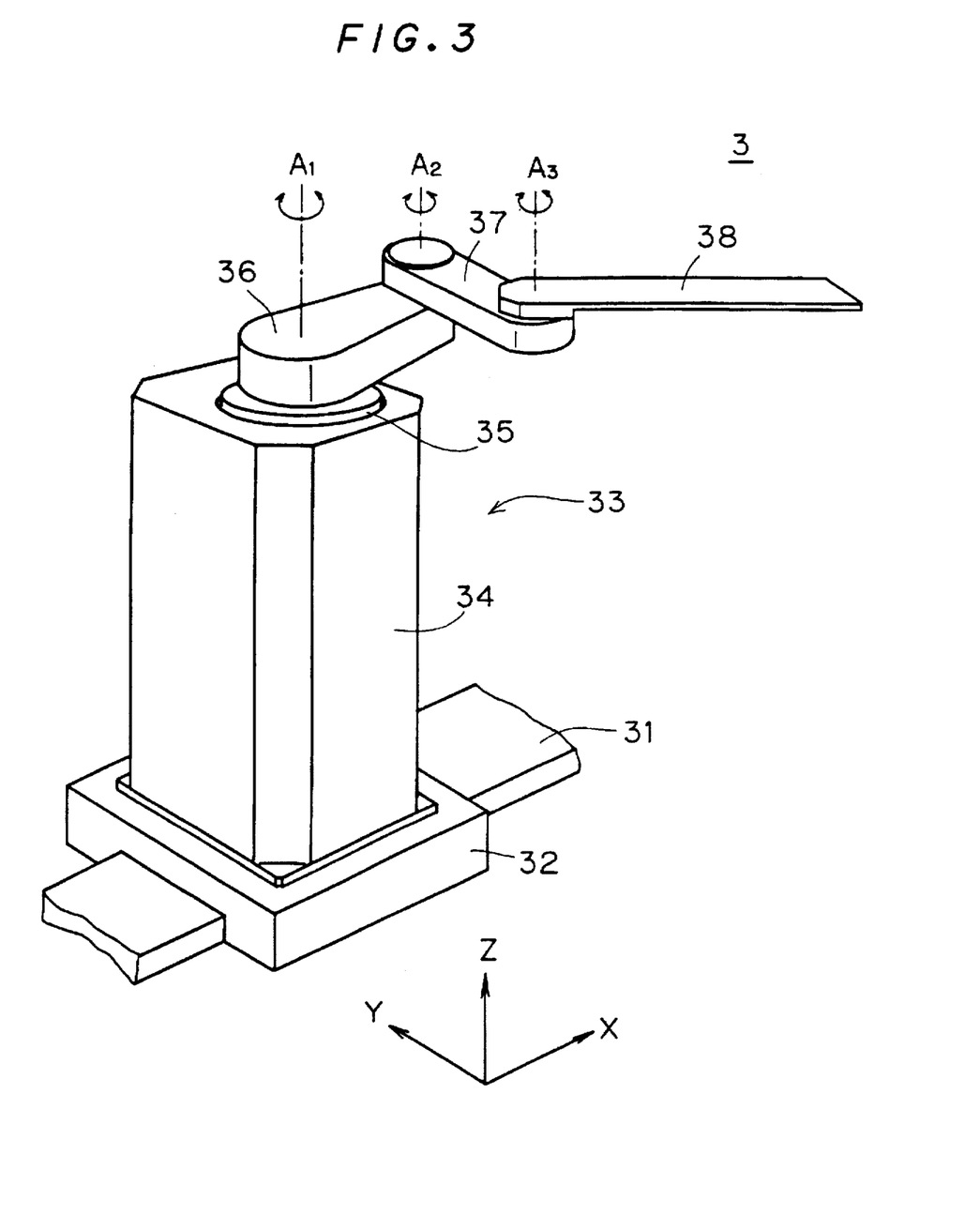
FIG. 3 is a perspective view of a transport part.

FIG. 3 is a perspective view of the transporting system 3. The transporting system 3 is disposed in a transport space 6 (FIGS. 1 and 2) between the cassette storing system 1 and the processing system 2. In the transport space 6, a guide rail 31 (FIG. 3) is fixed to a bottom portion of the substrate processing apparatus to extend in the direction X. A base 32 engages the guide rail 31 and is capable of moving back and forth in the direction X. An X-direction drive mechanism (not shown) is linked to the base 32. Actuated by an instruction from a control system (not shown) which controls the entire apparatus, the X-direction drive mechanism moves the base 32 in the direction X.

A triaxial transport robot 33 is fixed to the base 32. The X-direction drive mechanism drives the transport robot 33 to move back and forth along the arrangement of the cassettes 4 and along an arrangement of processing units which are disposed in the processing system 2 so that the transport robot 33 is moved between desired ones of the cassettes 4 and desired ones of the processing units.

The transport robot 33 includes a column 35 which may be extended from a robot body part 34 in a vertical direction Z. Linked to a Z-direction drive mechanism (not shown), the column 35 extends and retracts in the vertical direction Z when the Z-direction drive mechanism is driven by an instruction from the control system. One end of a first arm 36 which extends in a horizontal direction is attached to a tip portion of the column 35 so as to be freely rotatable about a rotation axis A1. One end of a second arm 37 is linked to the other end of the first arm 36 for free rotation about a rotation axis A2, while one end of a hand 38 is linked to the other end of the second arm 37 for free rotation about a rotation axis A3. The transport robot 33 includes a motor (not shown) which rotates the first arm 36 about the rotation asix A1. A link mechanism is disposed between the first arm 36 and the second arm 37, and the other link mechanism is also disposed between the second arm 37 and the hand 38. Thus, if the first arm 36 is rotated by the motor, the second arm 37 is also rotated about the rotation axis A2 by the link mechanism in relation to the rotation of the first arm 36, and the hand 38 is further rotated about the rotation axis A3 by the other link mechanism in relation to the rotation of the second arm 37. The other end of the hand 38 includes a plurality of suction holes (not shown). Due to suction force applied through the suction holes, a substrate is held on the hand 38.

The transport robot 33 can move the hand 38 in three-dimensional directions in accordance with an instruction from the control system while holding a substrate on the hand 38 by suction force. The hand 38 with a substrate held thereon stops in front of a selected one of the cassettes 4 or a selected one of the processing units, and then loads or unloads the substrate into or from the selected cassette or unit. For example, when an instruction is supplied to the transport robot 33 which has stopped in front of the nearest cassette to an operation panel 7 of the control system as shown in FIG. 1, the transport robot 33 can remove a substrate from this cassette 4.

Although the X-direction drive mechanism drives the base 32 which is movable back and forth in the direction X along the guide rail 31, and as a result, the triaxial transport robot 33 which is fixed to the base 32 transports a substrate in three-dimensional directions in the transporting system 3 of the embodiment. However, the structure of the transporting system 3 is not limited to this. As far as being able to transport a substrate among the processing units and between the cassettes 4 and the processing units, the transporting system 3 may have other structures.

Figure 4:
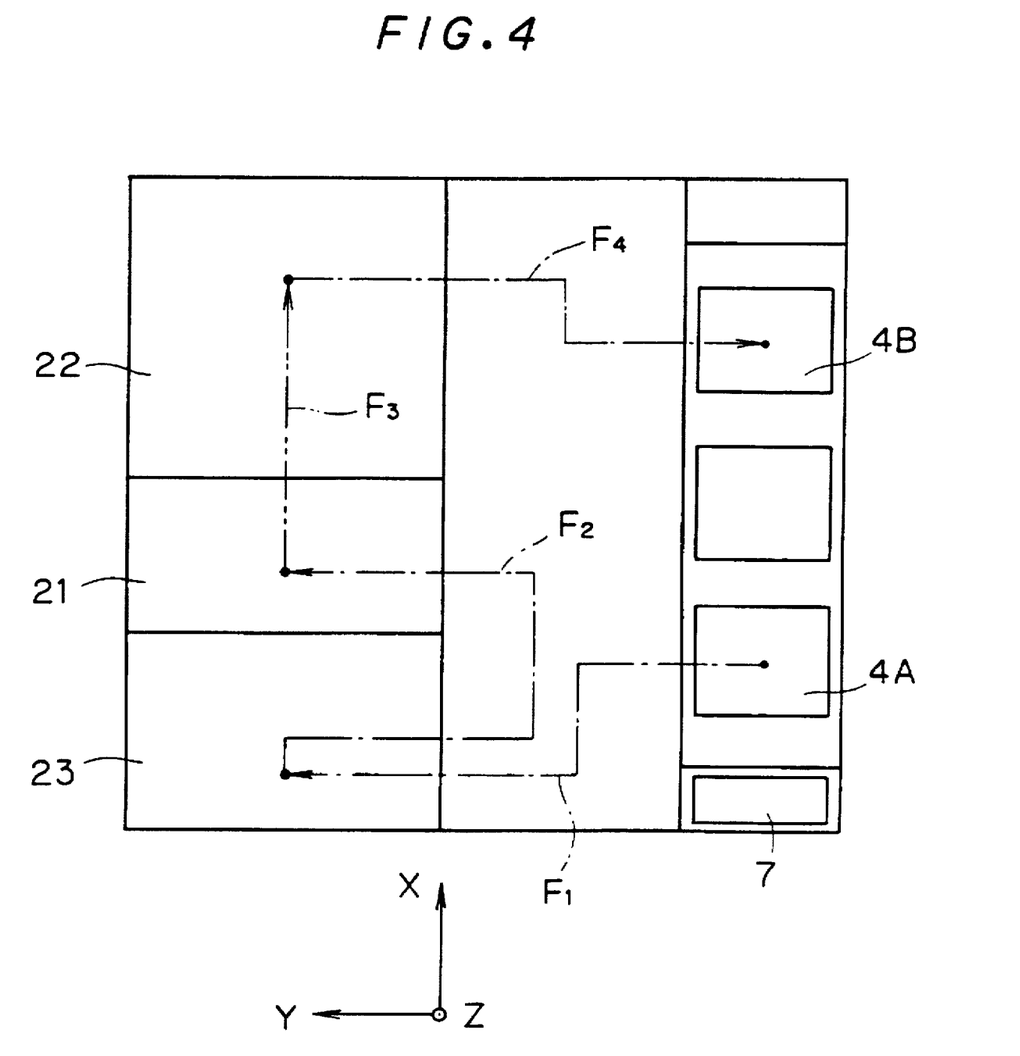
FIG. 4 is a plan view showing an operation of the substrate processing apparatus of FIG. 1.

Now, an operation of the substrate processing apparatus having such a construction above will be described in reference to FIG. 4. Here, it is assumed that the cassette 4A which is nearest to the operation panel 7 is used to store unprocessed substrates and the cassette 4B which is farthest from the operation panel 7 is used to store processed substrates. A description will be given on an order of cleaning processes which are performed on one substrate. It is to be noted that the invention is not limited to the specific order and combination of the processes the described below. In FIG. 4, a substrate transport line for the transporting system 3 is indicated by the dash, one-dot line and a substrate transport line for the transport hand 5 is indicated by the dash, two-dot line.

First, after the transport robot 33 has moved in the direction X and has stopped in front of the cassette 4A, the column 35 of the robot 33 moves upward so that the hand 38 is positioned a little lower than the height of a target substrate to be processed which is stored in the cassette 4A. The motor is then driven, thereby moving the hand 38 to just below the back surface of the substrate. The column 35 is moved further upward, and the substrate is received by the hand 38, held thereon by suction force and lifted up in the cassette 4A. Following this, the hand 38 retracts driven by the motor to remove the substrate from the cassette 4A.

Next, the transport robot 33 moves in a direction (−X) along the guide rail 31 and stops in front of a shutter 23a of the UV lamp house 23 (See FIG. 1). Controlled by the column 35, the hand 38 moves to locate the substrate at the same height as the shutter 23a which will be subsequently opened. The hand 38 moves forward and enters into the UV lamp house 23 (as shown by the arrow F1). Upon setting of the substrate into the UV lamp house 23, the hand 38 withdraws, the shutter 23a closes and dry cleaning starts.

When dry cleaning in the UV lamp house 23 is finished, the transport robot 33 moves back to the UV lamp house 23 and the shutter 23a opens. The hand 38 moves forward to receive the substrate from the UV lamp house 23. The hand 38 then retracts and the shutter 23a is closed. The substrate is unloaded from the UV lamp house 23 in this manner.

As shown by the arrow F2, the substrate unloaded from the UV lamp house 23 is transferred to the brush module 21. In FIG. 4, the substrate is moved in the direction X (arrow F2). However, this is only for convenience of illustration. The substrate is transferred to the brush module 21 in the following manner since a shutter 21a of the brush module 21 is located immediately below the shutter 23a of the UV lamp house. That is, the column 35 moves downward so as to move the substrate which is held on the hand 38 to the same height of the shutter 21a of the brush module 21 without moving the transport robot 33 in the direction X. The shutter 21a then is opened and the hand 38 moves forward. The substrate is thereafter inserted into the brush module 21.

The substrate is cleaned at both of its surfaces (or the back surface only) in the brush module 21. The cleaned substrate is pushed upward in the direction Z from an opening 21b (FIG. 1) by push-up pins (not shown) which are disposed in the brush module 21, and transferred to the transport hand 5 which is located above the opening 21b. Following this, the transport hand 5 holding the substrate is moved by a hand drive mechanism 8 (FIG. 1) in the direction X and stopped above the spin part 22. The substrate is thereafter transferred and set to the spin part 22 (arrow F3).

A series of surface cleaning processes are performed onto the upper surface of the substrate which is set to the spin part 22. First, the substrate is rotated while in contact with a rotation brush 22a (FIG. 1) while cleaning liquid is being supplied. Next, the substrate is further rotated while being supplied cleaning liquid vibrated supersonically, the cleaning liquid being showered on the substrate from a supersonic cleaning nozzle 22b. Finally, the substrate is further rotated for being rinsed with pure water supplied from a pure water nozzle 22c. After that, the substrate is further rotated at a high speed for being dried.

Upon surface cleaning in the spin part 22, the transport robot 33 moves to the spin part 22. The hand 38 enters the spin part 22 to receive the substrate and exits from the spin part 22 with the substrate held thereon by suction force in the same manner as described above. The transport robot 33 then moves to the cassette 4B to load the substrate into the cassette 4B in a reversed manner from that of unloading the substrate from the cassette 4A (arrow F4). The substrate which went through all the cleaning processes by the processing units is transferred to the cassette 4B. Each substrate is cleaned in this manner.

These operations as above are repeated to clean all substrate which are contained in the cassette 4A.

As described above, in the present embodiment, the transporting system 3 can transport a substrate freely among the processing units and between the cassettes 4 and the processing units. In other words, the transporting system 3 accesses the processing units while holding a substrate in any desired order depending on a need. It is therefore possible to change the order of the surface treatments in an easy manner.

The present embodiment is advantageous over the conventional technique disclosed by U.S. Pat. No. 4,985,722. The apparatus of this embodiment is simple since it is possible to transport a substrate between the cassettes 4 and the processing units by the transporting system 3, whereas this conventional technique requires the interface mechanism in the loading/unloading section to load and unload a substrate into and from the cassette 4. The treatment processes are also simple since it is not necessary to transport a substrate between the interface mechanism and the conveying mechanism.

In addition, since the transporting system 3 is disposed between the cassette storing system 1 and the processing system 2 which are arranged in an opposing relation, the transport space 6 is sufficient as a substrate transport space. This contributes to a reduction in the size of the substrate processing apparatus, which in turn increases the freedom of the layout of the substrate processing system including the substrate processing apparatus and makes it easy to change the location of the substrate processing apparatus within the system.

Further, since the processing system 2 includes the spin part 22 which cleans a substrate while spinning the substrate, it is possible to load a substrate which was unloaded from the cassette 4A into the cassette 4B in any desired direction regardless of the orientation of substrates contained within the cassette 4A. That is, by controlling the orientation of the substrate in the spin part when spinning of the substrate is stopped, it is possible to load the substrate into the cassette 4B so that a rim portion of the substrate which used to be located immediately in front of the opening of the cassette 4A is located farthest from the opening in the cassette 4B when the spinning treatment is finished, or if desired immediately in front of the opening in the cassette 4B when the spinning treatment is finished. The orientation of loaded substrates is freely selected substrate by substrate, or cassette by cassette, or rot by rot.

While the embodiment disclosed includes three types of the processing units disposed in the processing system 2 and three cassettes 4 disposed in the cassette storing system 1 the invention is not so limited. Other types and number of the processing units or other numbers of cassettes 4 may be used. For example, six cassettes 4 may be disposed in the cassette storing system 1 and the same types of the processing units as above may be additionally disposed in the processing system 2 along the direction X. However, in such a structure, since effective transportation of a substrate is difficult and a tact time becomes longer in some cases with only one transport robot 33, a plurality of transport robots 33 may be disposed in the transport space 6 depending on the structures of the cassette storing system 1 and the processing system 2.

The embodiment above also requires that the hand 5 transports a substrate from the brush module 21 to the spin part 22 mainly because the hand 38 must not be wet. If the hand 38 receives a substrate which is wet at the back surface due to previous cleaning performed by the brush module 21, this will be a big problem later. To avoid this, the brush module 21 may include a mechanism such as an air knife for drying a substrate which was already cleaned at the both surfaces (or only the back surface). With such a mechanism, a substrate is transported with the back surface dry from the brush module 21 to the spin part 22, which makes it possible to transport the substrate to the spin part 22 by the transport robot 33 and to omit the transport hand 5 and the hand drive mechanism 8.

Figure 5:
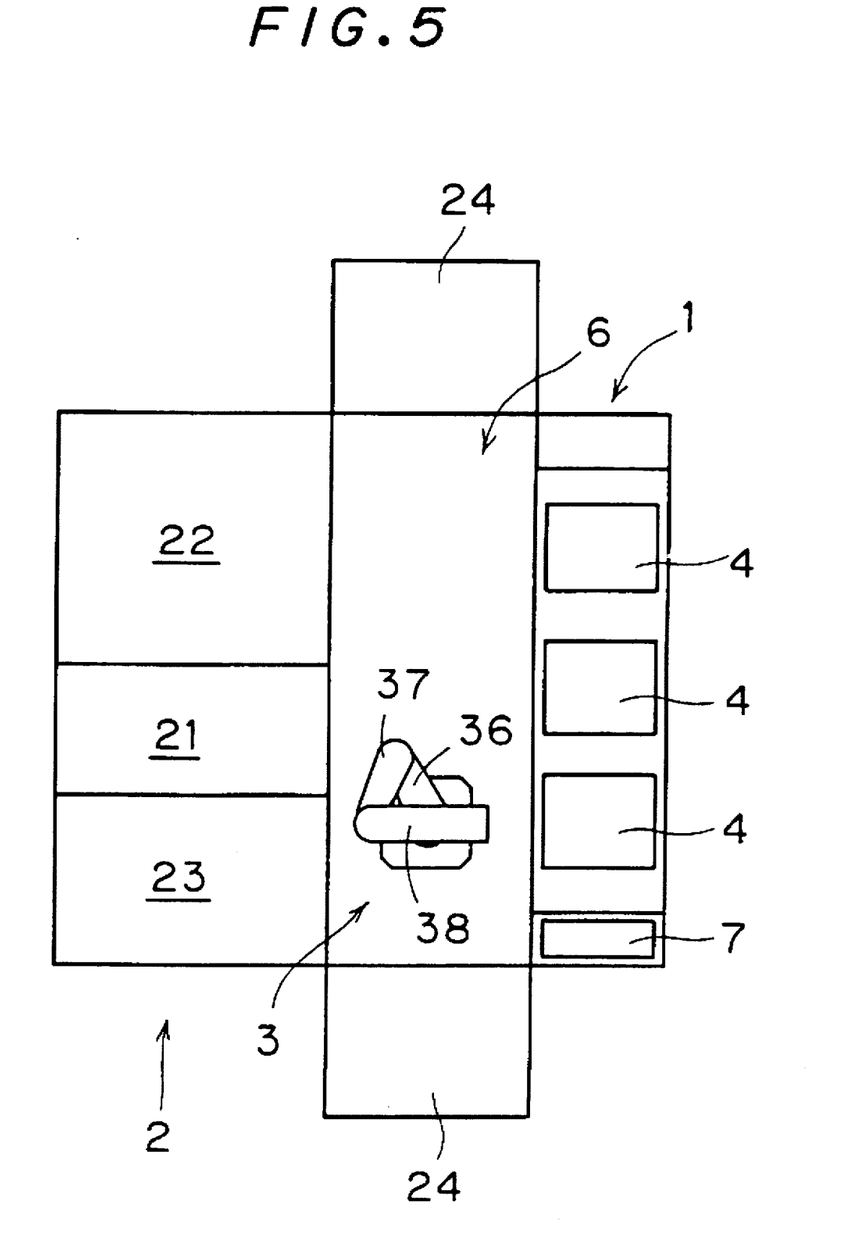
FIG. 5 is a plan view of a substrate processing apparatus according to a modification of the present invention.
Figure 6:
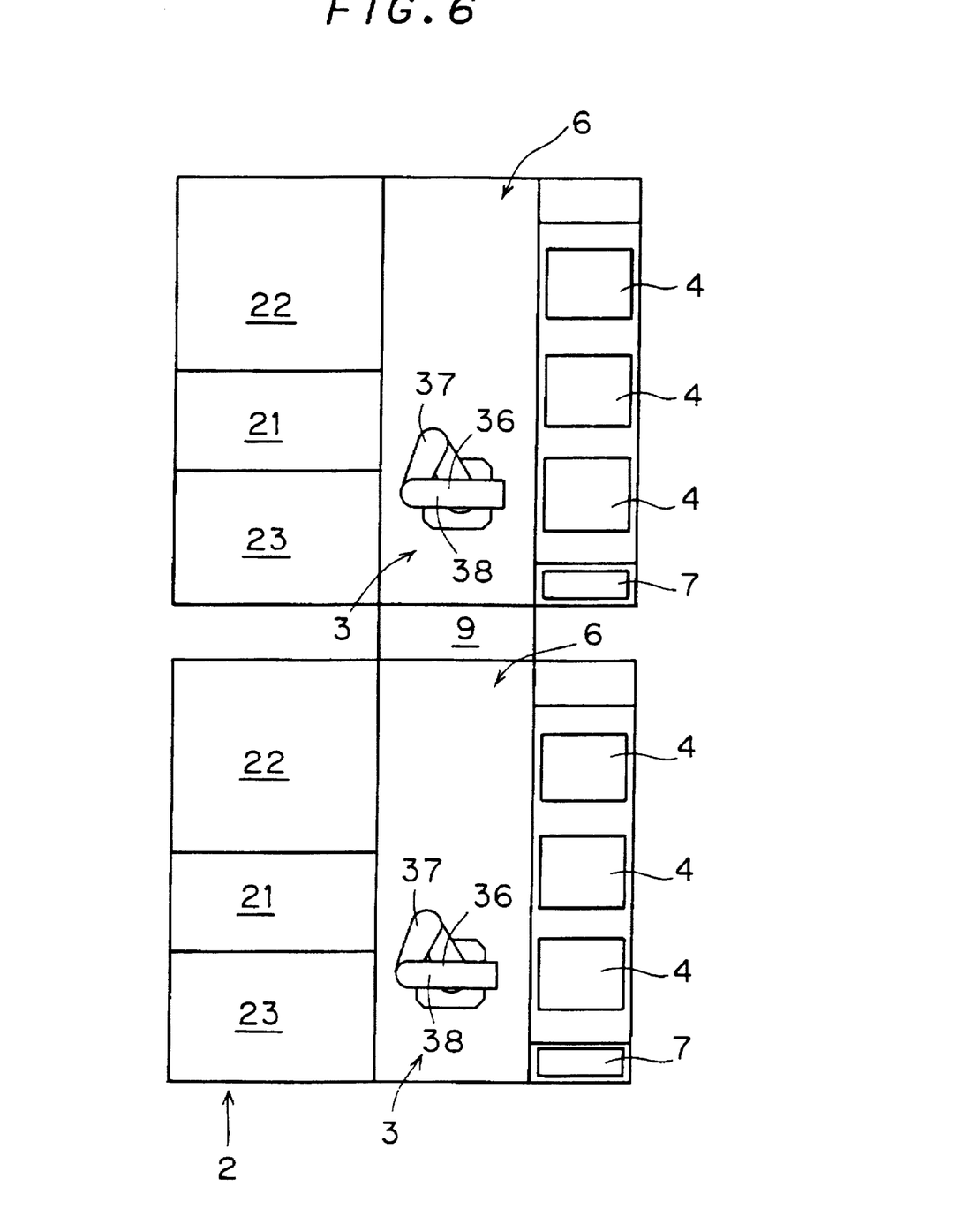
FIG. 6 is a plan view of a substrate processing apparatus according to other modification of the present invention.

Additional processing units 24 or other type units may be disposed at the both sides of the transport space 6 as shown in FIG. 5 to utilize the transport robot 33 more efficiently. The additional processing unit 24 or the type unit may be selectively disposed at one end side of the transport space 6. Only one such substrate processing apparatus as hereinabove described may be used, or as shown in FIG. 6, two such substrate processing apparatuses may be serially arranged. Further alternatively, the substrate processing apparatus may be linked to other type of substrate processing apparatus with an interface 9 interposed therebetween for one-way or two-way transportation of substrates between the two substrate processing apparatuses.

The foregoing has described the substrate processing apparatus of the embodiment as an apparatus for cleaning a substrate, the present invention is not limited to this particular use. Rather, the present invention is applicable to any substrate processing apparatuses in general such as a substrate processing apparatus for coating a substrate with a resist or a substrate processing apparatus for developing a substrate.

While the invention has been described in detail, the foregoing description is in all aspects illustrative and not restrictive. It is understood that numerous other modifications and variations can be devised without departing from the scope of the invention.

We claim:

1. A substrate processing apparatus for transporting a plurality of substrates, which are stored in a cassette serially one by one, to a plurality of processing units in which each of a substrate set therein is processed in a respective manner, comprising:

cassette storing means for storing a plurality of cassettes, each of which is capable of storing a plurality of substrates, said plurality of cassettes being arranged in a predetermined direction;

processing means, including a plurality of processing units, for processing the substrate in a predetermined manner, said plurality of processing units being arranged parallel to said predetermined direction; and transporting means, disposed between said cassette storing means and said processing means, said transporting means including a holding member which transports the substrate stored in said cassette in said cassette storing means to one of the processing units in the processing means and transports the substrate processed by said processing means to the cassette, said holding member being capable of moving along said predetermined direction holding the substrate to be transported and capable of stopping in front of said one of the processing units and in front of said cassette.

2. The substrates processing apparatus of claim 1, wherein said plurality of processing units include spin cleaning means for cleaning the substrate while rotating it.

3. The substrate processing apparatus of claim 2, wherein said plurality of processing units include brush cleaning means for cleaning the substrate with using a cleaning brush which cleans a surface of said substrate.

4. The substrate processing apparatus of claim 3, wherein said brush cleaning means can operate prior to said spin cleaning means, with respect to a substrate.

5. The substrate processing apparatus of claim 4, further comprising second means for transporting the substrate processed by said brush cleaning means to said spin cleaning means.

6. The substrate processing apparatus of claim 1, wherein said transporting means includes means for moving said holding member and stopping it in front of one of said plurality of cassettes to take out a substrate stored in said cassette, and means for moving said holding member with holding said substrate to a position in front of one of said plurality of processing units to set said substrate to said processing unit.

7. The substrate processing apparatus of claim 1, wherein said holding member is capable of moving along said predetermined direction within a predetermined range, and further comprising an additional processing unit disposed to face said holding member when said holding member is located at either end of its predetermined range.

8. The substrate processing apparatus of claim 1, wherein said holding member is capable of moving along said predetermined direction and of stopping in front of one of the plurality of processing units to take out a substrate processed by said processing unit, is capable of moving along said predetermined direction with holding said substrate and of stopping in front of another one of the plurality of processing units to set said substrate to said other processing unit.

9. A substrate processing apparatus, comprising:

a transporting robot movable along a linear path;

a plurality of cassettes, each of said cassettes capable of holding a respective plurality of substrates, said plurality of cassettes being arranged along a first linear line, generally parallel to said linear path;

a plurality of processing units, each said processing unit capable of performing a respective process on a substrate brought into operational engagement therewith, said processing units being arranged along a second linear line, generally parallel to said linear path;

said linear path being located between said first and second linear lines.

10. A substrate processing apparatus according to claim 9, wherein said transporting robot can retrieve substrates from and insert substrates into said cassettes one by one.

11. A substrate processing apparatus according to claim 10, wherein each of said cassettes has an opening through which said transporting robot can retrieve substrates from and insert substrates into said cassette, each of said openings facing said linear path.

12. A substrate processing apparatus according to claim 9, wherein said transporting robot can transport substrates from any one of said processing units to each of the other of said processing units.

13. A substrate processing apparatus according to claim 9, wherein at least one of said processing units comprises a spin cleaning processing unit for cleaning a substrate while spinning it.

14. A substrate processing apparatus according to claim 13, wherein at least one of said processing units is a brush cleaning processing unit for cleaning a substrate with a cleaning brush which cleans a surface of said substrate.

15. A substrate processing apparatus according to claim 14, wherein said transporting robot brings each substrate to said brush cleaning apparatus before said substrate is brought to said spin cleaning apparatus.

16. A substrate processing apparatus according to claim 15, further comprising a transport mechanism for transporting each substrate processed by said brush cleaning apparatus to said spin cleaning apparatus.

17. A substrate processing apparatus for transporting a plurality of substrates, which are stored in a cassette serially one by one, to a plurality of processing units in which each of a substrate set therein is processed in a respective manner, comprising:

a cassette storing system for storing a plurality of cassettes, each of which is capable of storing a plurality of substrates, said plurality of cassettes being arranged in a predetermined direction;

a processing system, including a plurality of processing units, for processing the substrate in a predetermined manner, said plurality of processing units being arranged parallel to said predetermined direction; and a transporting system, disposed between said cassette storing system and said processing system, said transporting system including a holder member which transports the substrate stored in said cassette in said cassette storing system to one of the processing units in the processing system and transports the substrate processed by said processing system to the cassette, said holding member being capable of moving along said predetermined direction holding the substrate to be transported and capable of stopping in front of said one of the processing units and in front of said cassette.

* * * * *